US012687942B2

(12) United States Patent
  Lius

(10) Patent No.: US 12,687,942 B2
(45) Date of Patent: *Jul. 21, 2026

(54) DISPLAY DEVICE

(71) Applicant: InnoLux Corporation, Miao-Li County (TW)

(72) Inventor: Chandra Lius, Miao-Li County (TW)

(73) Assignee: InnoLux Corporation, Cha-Nan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/765,698

(22) Filed: Jul. 8, 2024

(65) Prior Publication Data

US 2024/0365638 A1      Oct. 31, 2024

Related U.S. Application Data

(63) Continuation of application No. 18/079,450, filed on Dec. 12, 2022, now Pat. No. 12,063,838, which is a
(Continued)

(51) Int. Cl.
  *G06F 3/041* (2006.01)
  *G02F 1/1333* (2006.01)
  (Continued)

(52) U.S. Cl.
  CPC ........ *G06F 3/0412* (2013.01); *G02F 1/13338* (2013.01); *G02F 1/133512* (2013.01);
  (Continued)

(58) Field of Classification Search
  CPC .. H10K 59/40; H10K 50/8428; H10K 59/122; H10K 59/124; H10K 59/126;
  (Continued)

(56) References Cited

U.S. PATENT DOCUMENTS 11,567,248 B2    1/2023  Baek ...................... H10K 59/38
2008/0246708 A1  10/2008 Ishiguro
  (Continued)

FOREIGN PATENT DOCUMENTS

CN       102782622 A    11/2012
CN       106773219 A     5/2017
  (Continued)

*Primary Examiner* — Sahlu Okebato
(74) *Attorney, Agent, or Firm* — MUNCY, GEISSLER, OLDS & LOWE, P.C.

(57) ABSTRACT

A display device is provided, which has a display region and includes: a substrate having a first surface and a second surface; a driving layer disposed on the first surface; a self-emitting layer disposed on the driving layer and including a reflective electrode; a plurality of sensors overlapping the display region in a normal direction of the first surface; a pixel defining layer disposed on the reflective electrode, wherein the pixel defining layer comprises a top surface and a bottom surface facing the driving layer; a spacer disposed on the top surface; and a plurality of first touch electrodes and second touch electrodes disposed in the display region, wherein in the normal direction of the first surface, at least two sensors overlaps one of the first touch electrodes or one of the second touch electrodes; wherein the sensors are adjacent to the second surface away from the driving layer.

8 Claims, 14 Drawing Sheets

Related U.S. Application Data continuation of application No. 17/196,647, filed on Mar. 9, 2021, now abandoned, which is a continuation of application No. 15/889,529, filed on Feb. 6, 2018, now abandoned.

(51) Int. Cl.

| | |
|---|---|
| *G02F 1/1335* | (2006.01) |
| *G02F 1/1362* | (2006.01) |
| *H10K 59/122* | (2023.01) |
| *H10K 59/124* | (2023.01) |
| *H10K 59/126* | (2023.01) |
| *H10K 59/38* | (2023.01) |
| *H10K 59/40* | (2023.01) |
| *H10K 59/80* | (2023.01) |
| *G02F 1/1339* | (2006.01) |
| *G02F 1/1343* | (2006.01) |
| *G02F 1/1368* | (2006.01) |
| *H10K 59/121* | (2023.01) |
| *H10K 59/60* | (2023.01) |

(52) U.S. Cl.

CPC ........ *G02F 1/136209* (2013.01); *G06F 3/041* (2013.01); *H10K 59/122* (2023.02); *H10K 59/124* (2023.02); *H10K 59/126* (2023.02); *H10K 59/38* (2023.02); *H10K 59/40* (2023.02); *H10K 59/8723* (2023.02); *G02F 1/133553* (2013.01); *G02F 1/13394* (2013.01); *G02F 1/13439* (2013.01); *G02F 1/1368* (2013.01); *G02F 1/13685* (2021.01); *G02F 2201/58* (2013.01); *H10K 59/1213* (2023.02); *H10K 59/60* (2023.02); *H10K 59/80518* (2023.02); *H10K 59/80524* (2023.02)

(58) Field of Classification Search

CPC .... H10K 59/38; H10K 50/818; H10K 50/828; H10K 59/1213; H10K 59/60; G02F 1/13338; G02F 1/133512; G02F 1/136209; G02F 1/133553; G02F 1/13394; G02F 1/13439; G02F 1/1368; G02F 1/13685; G02F 2201/58; G02F 1/134318; G02F 1/134363; G06F 3/041; G06F 3/0445; G06F 3/0446; G06F 3/0412

See application file for complete search history.

(56) References Cited

U.S. PATENT DOCUMENTS

| | | | |
|---|---|---|---|
| 2011/0187669 A1 | 8/2011 | Abiru et al. | |
| 2011/0187676 A1 | 8/2011 | Chang | H03K 17/962 |
| | | | 345/174 |
| 2011/0188767 A1 | 8/2011 | Chang | |
| 2011/0221723 A1 | 9/2011 | Kurokawa et al. | |
| 2011/0227878 A1 | 9/2011 | Makita | |
| 2011/0248970 A1 | 10/2011 | Koyama et al. | |
| 2011/0255046 A1 | 10/2011 | Kurokawa et al. | |
| 2014/0168540 A1 | 6/2014 | Wang et al. | |
| 2016/0202814 A1* | 7/2016 | Lee | G06F 3/0443 |
| | | | 345/173 |
| 2016/0266695 A1 | 9/2016 | Bae et al. | |
| 2016/0350571 A1* | 12/2016 | Han | G06F 3/04164 |
| 2017/0161543 A1 | 6/2017 | Smith et al. | |
| 2017/0185203 A1* | 6/2017 | Seong | G06F 3/0443 |
| 2017/0220844 A1* | 8/2017 | Jones | G06V 40/1318 |
| 2017/0316248 A1 | 11/2017 | He et al. | |
| 2019/0115415 A1 | 4/2019 | Choi et al. | |
| 2019/0131378 A1 | 5/2019 | Sung et al. | |
| 2019/0245011 A1 | 8/2019 | Lius | |
| 2021/0217819 A1 | 7/2021 | Lius | |
| 2023/0109621 A1* | 4/2023 | Lius | H10K 59/8723 |
| | | | 345/173 |

FOREIGN PATENT DOCUMENTS

| | | |
|---|---|---|
| CN | 107480639 A | 12/2017 |
| CN | 107832749 A | 3/2018 |

* cited by examiner

DISPLAY DEVICE

CROSS REFERENCE TO RELATED APPLICATION

This application is a continuation (CA) of U.S. patent application for "Display device", U.S. application Ser. No. 18/079,450 filed on Dec. 12, 2022; U.S. application Ser. No. 18/079,450 is a continuation (CA) of U.S. application Ser. No. 17/196,647 filed on Mar. 9, 2021; U.S. application Ser. No. 17/196,647 is a continuation (CA) of U.S. application Ser. No. 15/889,529 filed on Feb. 6, 2018, and the subject matter of which is incorporated herein by reference.

BACKGROUND

1. Field

The present disclosure relates to a display device and, more particularly, to a display device comprising a sensor.

2. Description of Related Art

With the continuous advancement of technologies related to electronic devices, all the electronic devices are now developed toward compactness, thinness, and lightness. For example, thin display devices are the mainstream display devices on the market.

Nowadays, the display devices are required to have not only the display function but also other functions such as touch or identification functions. In addition, for a purpose that the display devices have higher display-to-body ratio, outer sensors have to be designed to be embedded into display regions of the display devices. Hence, how to integrate a sensor into the display device without reducing the accuracy or the resolution of the sensor and also without affecting the functions of the display device is one issue that should be solved.

SUMMARY

The present disclosure provides a display device having a display region, wherein the display device comprises: a substrate having a first surface and a second surface opposite to the first surface; a driving layer disposed on the first surface of the substrate; a self-emitting layer disposed on the driving layer and comprising a reflective electrode; a plurality of sensors overlapping the display region in a normal direction of the first surface of the substrate; a pixel defining layer disposed on the reflective electrode, wherein the pixel defining layer comprises a top surface and a bottom surface opposite to the top surface, and the bottom surface faces the driving layer; a spacer disposed on the top surface of the pixel defining layer; and a plurality of first touch electrodes and a plurality of second touch electrodes disposed in the display region, wherein in the normal direction of the first surface of the substrate, at least two of the plurality of sensors overlaps one of the plurality of first touch electrodes or one of the plurality of second touch electrodes; wherein the plurality of sensors are adjacent to the second surface of the substrate away from the driving layer.

Other novel features of the disclosure will become more apparent from the following detailed description when taken in conjunction with the accompanying drawings.

DETAILED DESCRIPTION OF EMBODIMENT

The following embodiments when read with the accompanying drawings are made to clearly exhibit the above-mentioned and other technical contents, features and/or effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the ordinals recited in the specification and the claims such as "above", "over", or "on" are intended not only directly contact with the other element, but also intended indirectly contact with the other element. Similarly, the ordinals recited in the specification and the claims such as "below", or "under" are intended not only directly contact with the other element but also intended indirectly contact with the other element. In addition, the features in different embodiments of the present disclosure can be mixed to form another embodiment.

Embodiment 1

Figure 1:
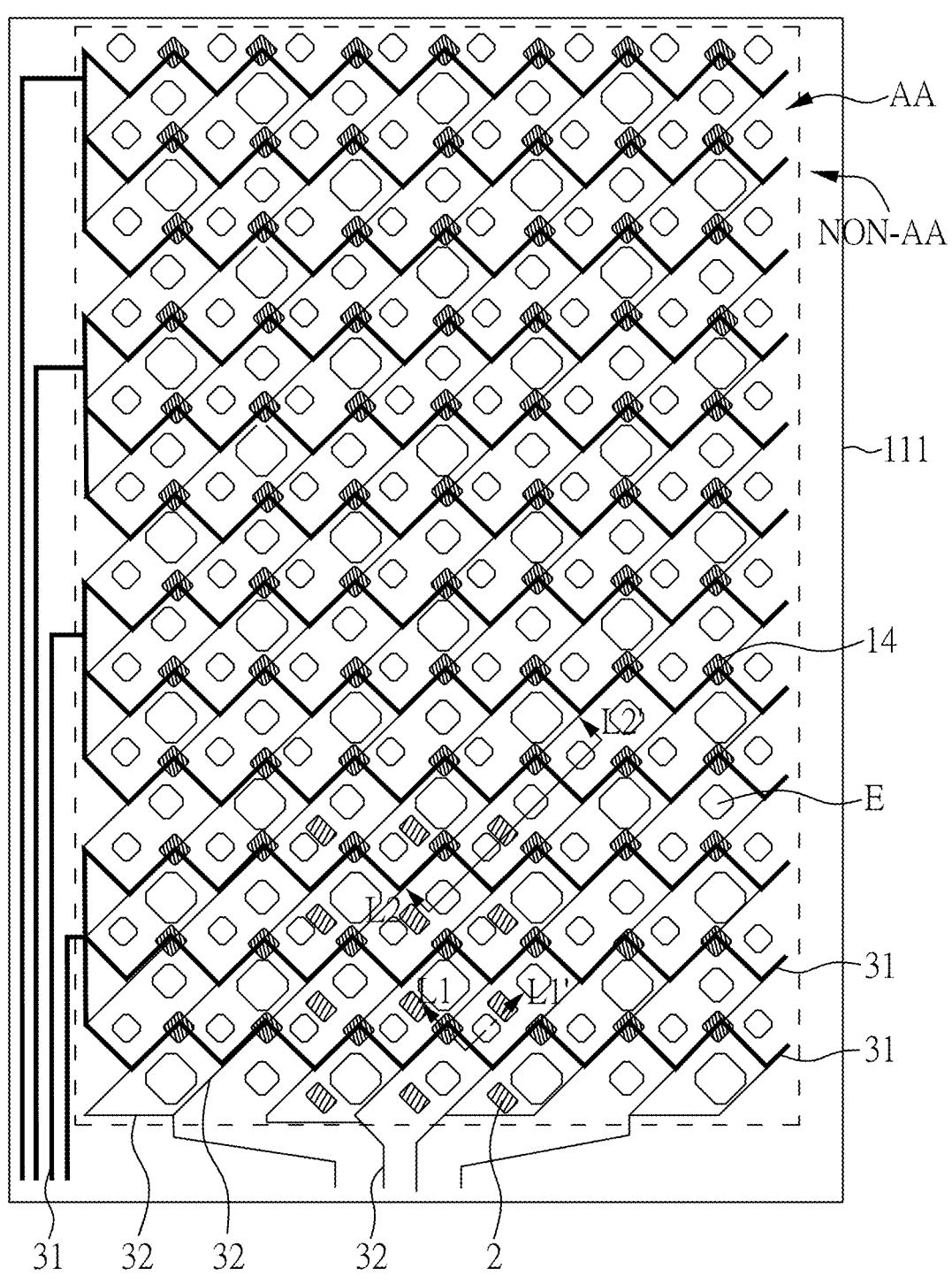
FIG. 1 is a top view of a display device according to Embodiment 1 of the present disclosure.

FIG. 1 is a top view of a display device according to the present embodiment, which shows partial display region of the display device. The display device of the present embodiment has a non-display region NON-AA and a display region AA, the display region AA comprises: spacers 14 disposed in the display region AA; and sensors 2 disposed in the display region AA. Herein, plural sensors 2 are disposed in one part of the display region AA (near to the bottom side of FIG. 1). However, the dispositions of the plural sensors 2 are not limited to that shown in FIG. 1. In another embodiment of the present disclosure, the sensors 2 can be disposed in more than one part of the display region AA or in the whole display region AA of the display device. In further another embodiment of the present disclosure, the sensors 2 can be disposed randomly or evenly in the display region AA of the display device.

As shown in FIG. 1, the sensors 2 do not overlap the spacers 14 in a normal direction of the display device. Herein, the normal direction of the display device is the direction perpendicular to a surface of a substrate 111.

Figure 2:
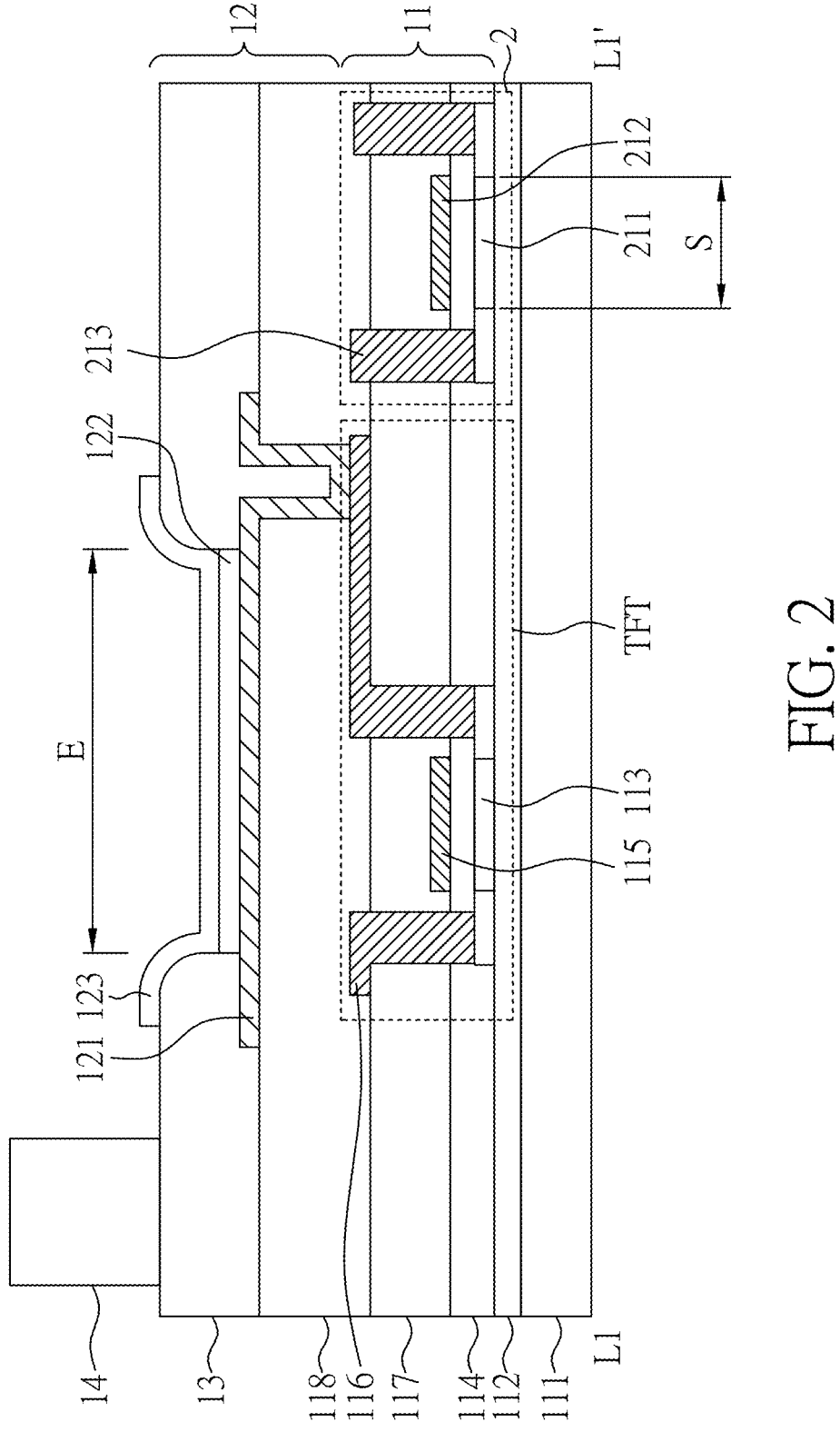
FIG. 2 is a cross-sectional view of a display device according to Embodiment 1 of the present disclosure.

FIG. 2 is a cross-sectional view of a display device of the present embodiment, which is a cross section along the line L1-L1' indicated in FIG. 1. In FIG. 2, touch electrodes 31, 32 are not shown to simplify the figure.

As shown in FIG. 2, the display device of the present embodiment is an organic light emitting diode (OLED) display device. The device of the present embodiment comprises: a substrate 111; a driving layer 11 disposed on the substrate 111; and a display medium layer 12 disposed on the driving layer 11; and a spacer 14 disposed on the display medium layer 12.

In detail, the display device of the present embodiment comprises: a substrate 111; a buffer layer 112 disposed on the substrate 111; a first semiconductor layer 113 disposed on the buffer layer 112; a gate insulating layer 114 disposed on the first semiconductor layer 113; a first gate electrode layer 115 disposed on the gate insulating layer 114 and corresponding to the first semiconductor layer 113; an insulating layer 117 disposed on the first gate electrode layer 115; a first source-drain electrode layer 116 disposed on the insulating layer 117 and electrically connected with the first semiconductor layer 113; and a passivation layer 118 disposed on the first source-drain electrode layer 116. The first semiconductor layer 113, the first gate electrode layer 115, and the first source-drain electrode layer 116 form a transistor TFT. In the present embodiment, the driving layer 11 comprises the first semiconductor layer 113, the gate insulating layer 114, the first gate electrode layer 115, the first source-drain electrode layer 116, the insulating layer 117, and the passivation layer 118. However, the structures of the driving layer 11 and the transistor TFT of the present disclosure are not limited to those shown in FIG. 2, and can be modified according to the device requirement. For example, the transistor TFT is a top gate transistor in the present embodiment, but the transistor TFT can be a bottom gate transistor in another embodiment of the present disclosure.

In the present embodiment, when forming the driving layer 11, a sensor 2 is simultaneously formed. The sensor 2 of the present disclosure has a transistor structure, which comprises: a second semiconductor layer 211; a second gate electrode layer 212 corresponding to the second semiconductor layer 211; and a second source-drain electrode layer 213 electrically connected with the second semiconductor layer 211. Hence, in the present embodiment, the sensor 2 is disposed on the substrate 111 and adjacent to the transistor TFT. In the present embodiment, the sensor 2 is a top gate transistor. In another embodiment of the present disclosure, the sensor 2 can be a bottom gate transistor. In further another embodiment of the present disclosure, the sensor 2 is not a transistor, and can have other structure (for example, a photodiode) as long as the purpose of signal sensing can be achieved. Examples of the sensor 2 can be a biometric sensor such as a fingerprint sensor, an iris sensor, a retina sensor, a facial sensor, a vein sensor, a voice sensor, a motion sensor, a gesture sensor, or a DNA sensor; but the present disclosure is not limited thereto.

Herein, the substrate 111 can be a quartz substrate, a glass substrate, a plastic substrate, other flexible substrates or films. When the substrate 111 is a plastic substrate, other flexible substrates or films, a flexible display device can be obtained. In addition, the material for the buffer layer 112 and the gate insulating layer 114 can be a silicon oxide, a silicon oxynitride, a silicon nitride or a combination thereof. Furthermore, the material for the first gate electrode layer 115, the first source-drain electrode layer 116, the second gate electrode layer 212 and the second source-drain electrode layer 213 can be metals (such as Cu, Al, Ti, Cr, Mo, or alloy thereof, or a combination of the abovementioned materials) or other electrode materials. Moreover, the material for the first semiconductor layer 113 and the second semiconductor layer 211 respectively can be amorphous silicon, polysilicon such as low-temperature polysilicon (LTPS) or oxide semiconductor such as indium gallium zinc oxide (IGZO). However, the present disclosure is not limited thereto.

As shown in FIG. 2, a passivation layer 118 is disposed on the first source-drain electrode layer 116. The material for the passivation layer 118 can be, for example, a silicon oxide, a silicon oxynitride, a silicon nitride, aluminum oxide, resin, polymer, photoresist, or a combination thereof; but the present disclosure is not limited thereto.

Then, a display medium layer 12 is formed on the passivation layer 118. In the present embodiment, the display medium layer 12 could be self-emitting layers, such as organic light emitting diodes. The organic light emitting diode comprises a first electrode 121, a light emitting layer 122, and a second electrode 123. The first electrode 121 electrically connects with the transistor TFT. A pixel defining layer 13 is disposed on the first electrode 121 and has an opening to expose the first electrode 121. The light emitting layer 122 is disposed in the opening and electrically connects with the first electrode 121. A second electrode 123 is disposed on the pixel defining layer 13 and electrically connects with the light emitting layer 122 through the opening. The opening of the pixel defining layer 13 defines a light emitting region E of the OLED. A spacer 14 is disposed on the pixel defining layer 13. The spacer 14 does not overlap the light emitting region E in the normal direction of the substrate 111. Herein, the first electrode 121 is a reflective electrode, and a material for the reflective electrode can be Ag, Al or other material with high reflective properties. The second electrode 123 is a transparent electrode, and a material for the transparent electrode can be a transparent conductive oxide such as ITO, IZO, ITZO, IGZO, or AZO. However, the present disclosure is not limited thereto.

In addition, a spacer 14 is disposed on the pixel defining layer 13. A material of the spacer 14 can be resin, polymer, photoresist, or a combination thereof, but the present disclosure is not limited thereto.

As shown in FIG. 1 and FIG. 2, in the display device of the present embodiment, the sensor 2 does not overlap the spacer 14 in a normal direction which is the direction vertical to the surface of the substrate 111. In particular, the sensor 2 comprises a sensing area S, and the spacer 2 does not overlap the sensing area S in the normal direction.

If the spacer 14 overlaps the sensor 2, the spacer 14 might affect or distort the incident light from an upper side of the display device to the sensor 2, and decrease the resolution of the sensor 2. Thus, in the present embodiment, the sensor 2 is designed not to overlap the spacer 14 to solve the aforesaid problem.

As shown in FIG. 1, in the present embodiment, the display region AA comprises plural light emitting regions E, and the sensor 2 does not overlap the light emitting regions E in the normal direction. Especially, as shown in FIG. 2, in the OLED display device of the present embodiment, the display medium layer 12 comprises OLED, wherein the first electrode 121 comprised in OLED is a reflective electrode, and the sensor 2 (in particular, the sensing area S) does not overlap the first electrode 121 in the normal direction. If the sensor 2 overlaps the first electrode 121 in the normal direction, the signal will be blocked by the first electrode 121 because the first electrode 121 is a reflective electrode.

Embodiment 2

Figure 3:
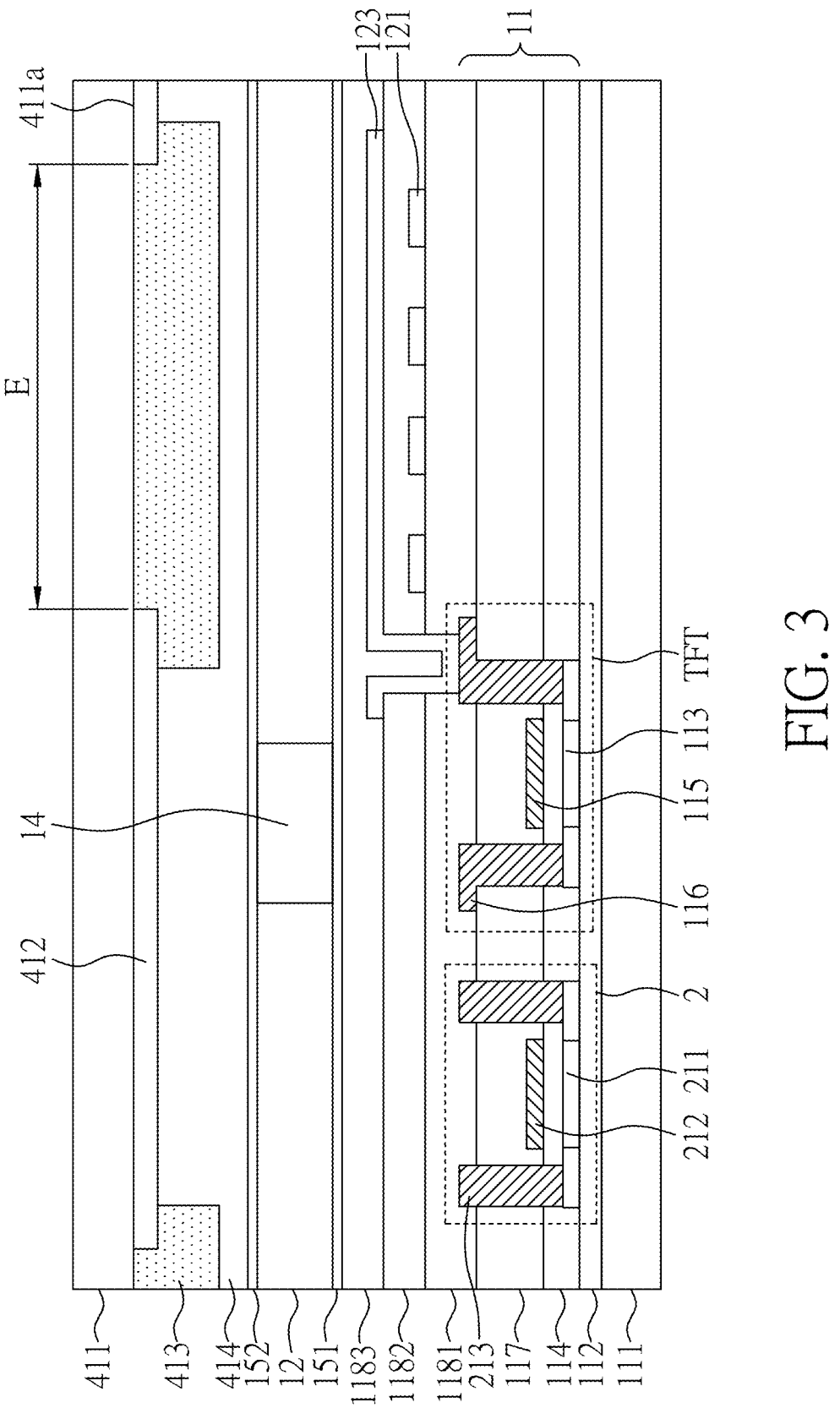
FIG. 3 is a cross-sectional view of a display device according to Embodiment 2 of the present disclosure.

FIG. 3 is a cross-sectional view of a display device according to the present embodiment 2. The display device of the present embodiment is similar to that of Embodiment 1, except that the display device of the present embodiment is a liquid crystal display (LCD) device.

As shown in FIG. 3, the driving layer 11 and the sensor 2 of the present embodiment are similar to those shown in Embodiment 1 and the illustrations thereof are not repeated again.

As shown in FIG. 3, the driving layer 11 is disposed on the substrate 111, and a first passivation layer 1181 is disposed on the first source-drain electrode layer 116. The display device of the present embodiment further comprises: a first electrode 121 disposed on the first passivation layer 1181; a second passivation layer 1182 disposed on the first electrode 121; a second electrode 123 disposed on the second passivation layer 1182; and a third passivation layer 1183 disposed on the second electrode 123. In the present embodiment, the second electrode 123 electrically connects with the transistor TFT. In the present embodiment, the first electrode 121 and the second electrode 123 form electrical field, triggering displaying mechanism of a fringe field switching (FFS) LCD device. In another embodiment of the present disclosure, the first electrode 121, not the second electrode 123, electrically connects with the transistor TFT. In addition, in the present embodiment, a homogenous aligned LCD device is disclosed. In another embodiment of the present disclosure, the display device can be a vertical aligned LCD device, wherein the second electrode 123 is disposed on a counter substrate 411.

Herein, the material for the first passivation layer 1181, the second passivation layer 1182 and the third passivation layer 1183 respectively can be, for example, a silicon oxide, a silicon oxynitride, a silicon nitride, aluminum oxide, resin, polymer, photoresist, or a combination thereof. In addition, the first electrode 121 and the second electrode 123 are transparent electrodes, and a material for the transparent electrode can be a transparent conductive oxide such as ITO, IZO, ITZO, IGZO, or AZO. However, the present disclosure is not limited thereto.

As shown in FIG. 3, the display device of the present embodiment further comprises: a counter substrate 411 having a surface 411a facing the substrate 111; a first light shielding layer 412 disposed on the surface 411a of the counter substrate 411, wherein the first light shielding layer 412 has a plurality of openings; a color filter layer 413 disposed in the openings of the first light shielding layer 412; and an overcoat layer 414 disposed on the color filter layer 413. Each of the openings of the first light shielding layer 412 defines a light emitting region E. The first light shielding layer 412 can be a black matrix, and the material for the overcoat layer 414 can be resin, polymer, photoresist, or a combination thereof.

In addition, a first alignment layer 151 is disposed on the third passivation layer 1183, a second alignment layer 152 is disposed on the overcoat layer 414, and the spacer 14 and the display medium layer 12 are disposed between the first alignment layer 151 and the second alignment layer 152. Herein, the display medium layer 12 is a liquid crystal layer.

Similar to Embodiment 1, the sensor 2 in the display device of the present embodiment does not overlap the light emitting region E in the normal direction of the substrate 111. The spacer 14 does not overlap the light emitting region E in the normal direction of the substrate 111. Therefore, the aperture ratio of the display device may not be affected by the sensor 2. In addition, since the sensor 2 is disposed under the first light shielding layer 412, the sensor 2 can only receive near IR or IR light signal, while visible light are shielded by the first light shielding layer 412.

Embodiment 3

Figure 4:
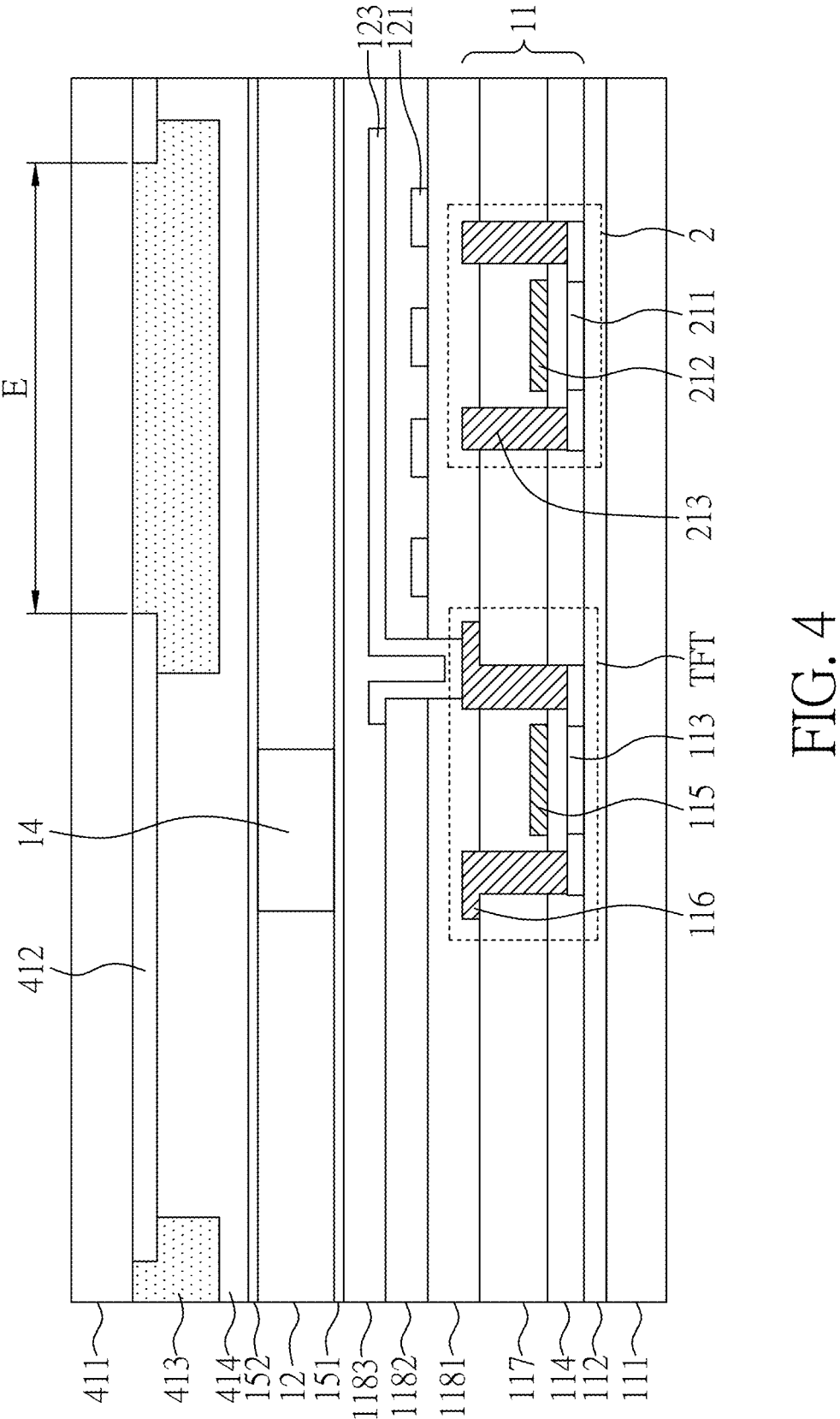
FIG. 4 is a cross-sectional view of a display device according to Embodiment 3 of the present disclosure.

FIG. 4 is a cross-sectional view of a display device according to the present embodiment. The display device of the present embodiment is similar to that of Embodiment 2, except for the sensor position.

In the present embodiment, the sensor 2 in the display device overlaps the light emitting region E in the normal direction of the substrate 111. Therefore, the sensor 2 could receive visible light, near IR or IR light signal. In one embodiment, the sensor 2 can be disposed under the color filter layer 413 with red or green resin, but the present disclosure is not limited thereto.

Embodiment 4

Figure 5:
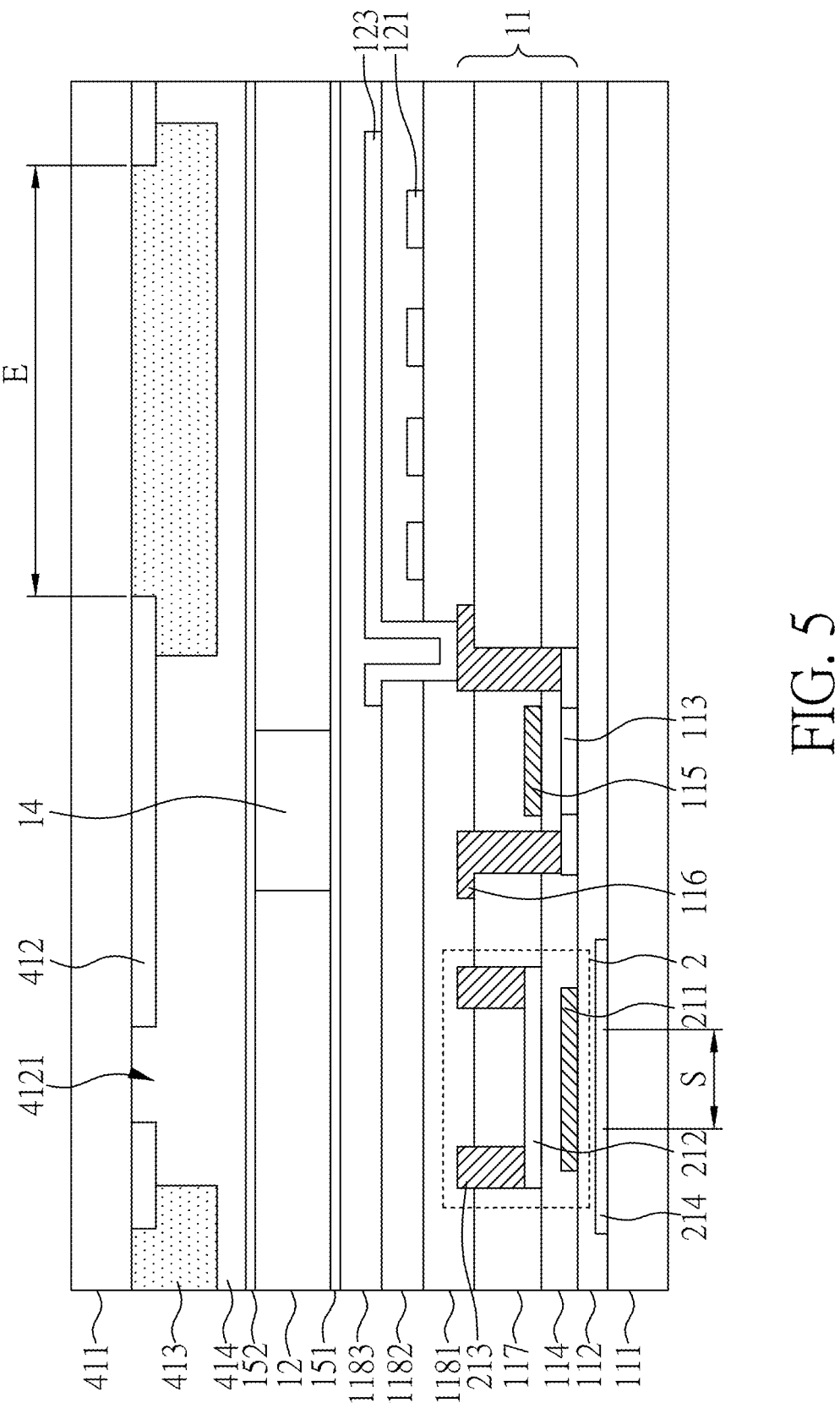
FIG. 5 is a cross-sectional view of a display device according to Embodiment 4 of the present disclosure.

FIG. 5 is a cross-sectional view of a display device according to the present embodiment. The display device of the present embodiment is similar to that of Embodiment 2, except for the following difference.

In the present embodiment, the first light shielding layer 412 has an opening 4121. The sensor 2 overlaps the opening 4121 but the spacer 14 does not overlap the opening 4121 in the normal direction. In addition, the sensor 2 comprises a sensing area S, the opening 4121 overlaps the sensing area S, and the spacer 14 does not overlap the sensing area S in the normal direction. When the first light shielding layer 412 has the opening 4121, visible light can reach to the sensor 2. The sensor 2 could receive visible light, near IR or IR light signal.

In addition, the structure of the sensor 2 in Embodiment 2 is a transistor with a top gate structure. In the present embodiment, the structure of the sensor 2 is a transistor with a bottom gate structure.

Furthermore, the display device of the present embodiment further comprises a second light shielding layer 214 disposed between the sensor 2 and the substrate 111, wherein the second light shielding layer 214 overlaps the opening 4121 in the normal direction to shield the light emitted from the backlight passing through the opening 4121 and producing a light dot.

Embodiment 5

Figure 6:
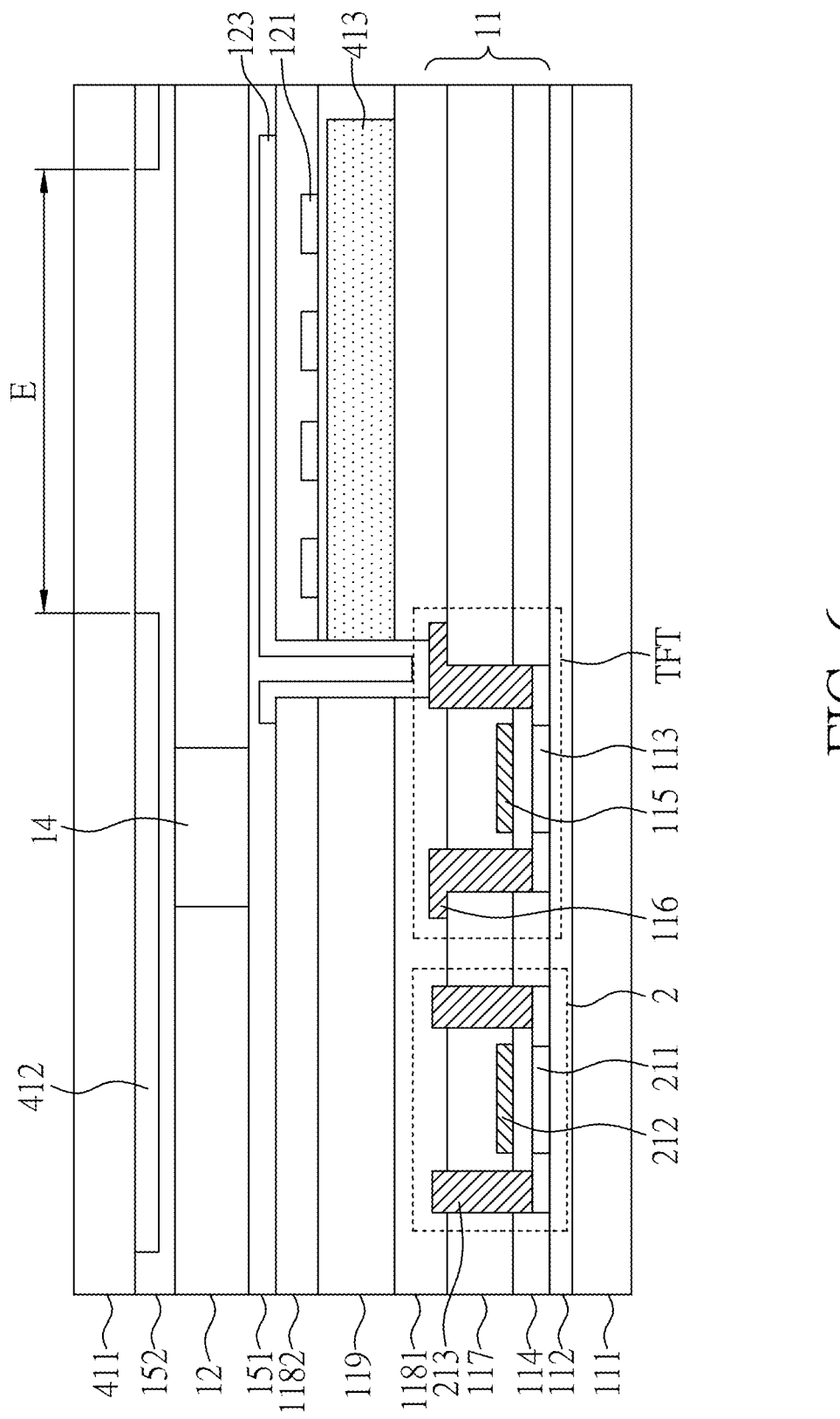
FIG. 6 is a cross-sectional view of a display device according to Embodiment 5 of the present disclosure.

FIG. 6 is a cross-sectional view of a display device according to the present embodiment. The display device of the present embodiment is similar to that of Embodiment 2, except for the following differences.

As shown in FIG. 6, the driving layer 11 and the sensor 2 of the present embodiment are similar to those shown in Embodiment 2 and the illustrations thereof are not repeated again.

As shown in FIG. 6, a first passivation layer 1181 is disposed on the first source-drain electrode layer 116. A color filter layer 413 is disposed on the first passivation layer 1181. A passivation layer 119 is disposed on the color filter layer 413. A first electrode 121 is disposed on the passivation layer 119. A second passivation layer 1182 is disposed on the first electrode 121. A second electrode 123 is disposed on the second passivation layer 1182 and electrically connects with the transistor TFT. Herein, the material for the passivation layer 119 can be, for example, resin, polymer, photoresist, or a combination thereof; but the present disclosure is not limited thereto.

Hence, in the present embodiment, the color filter layer 413 is not disposed on the counter substrate 411, but is disposed on the substrate 111 with transistor TFT formed thereon. Therefore, the display device of the present embodiment is a color filter on array (COA) LCD device.

Embodiment 6

Figure 7:
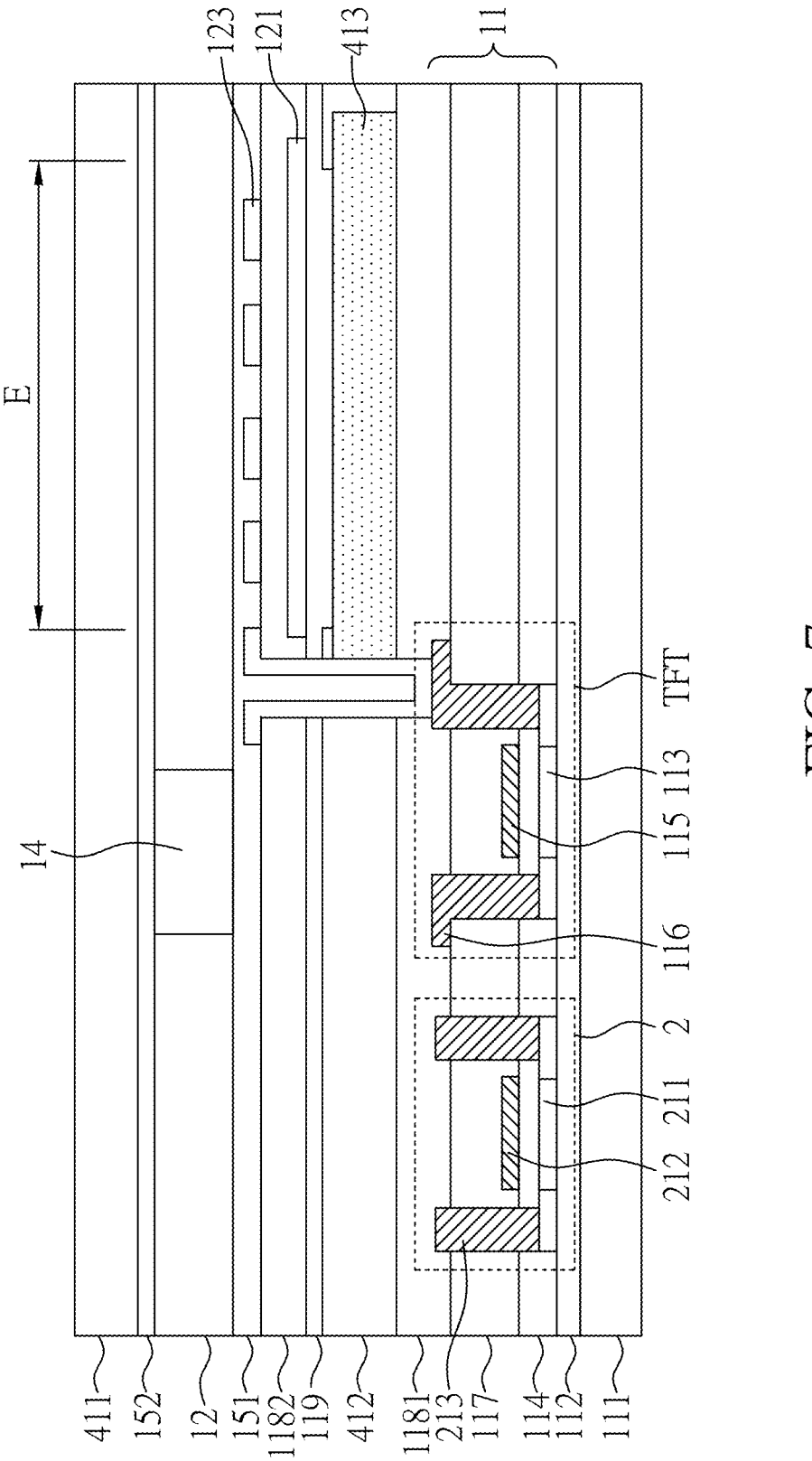
FIG. 7 is a cross-sectional view of a display device according to Embodiment 6 of the present disclosure.

FIG. 7 is a cross-sectional view of a display device according to the present embodiment. The display device of the present embodiment is similar to that of Embodiment 5, except for the following differences.

In the present embodiment, a first light shielding layer 412 is disposed between the first passivation layer 1181 and the passivation layer 119. Hence, the first light shielding layer 412 is not disposed on the counter substrate 411, but is disposed on the substrate 111 with transistor TFT formed thereon. Therefore, the display device of the present embodiment is a black matrix on array (BOA) LCD device.

In the aforementioned embodiments, only the relative positions between the spacers and the sensors are disclosed. In the following embodiments, the relative positions between the sensors and the touch electrodes are disclosed.

Embodiment 7

Figure 8:
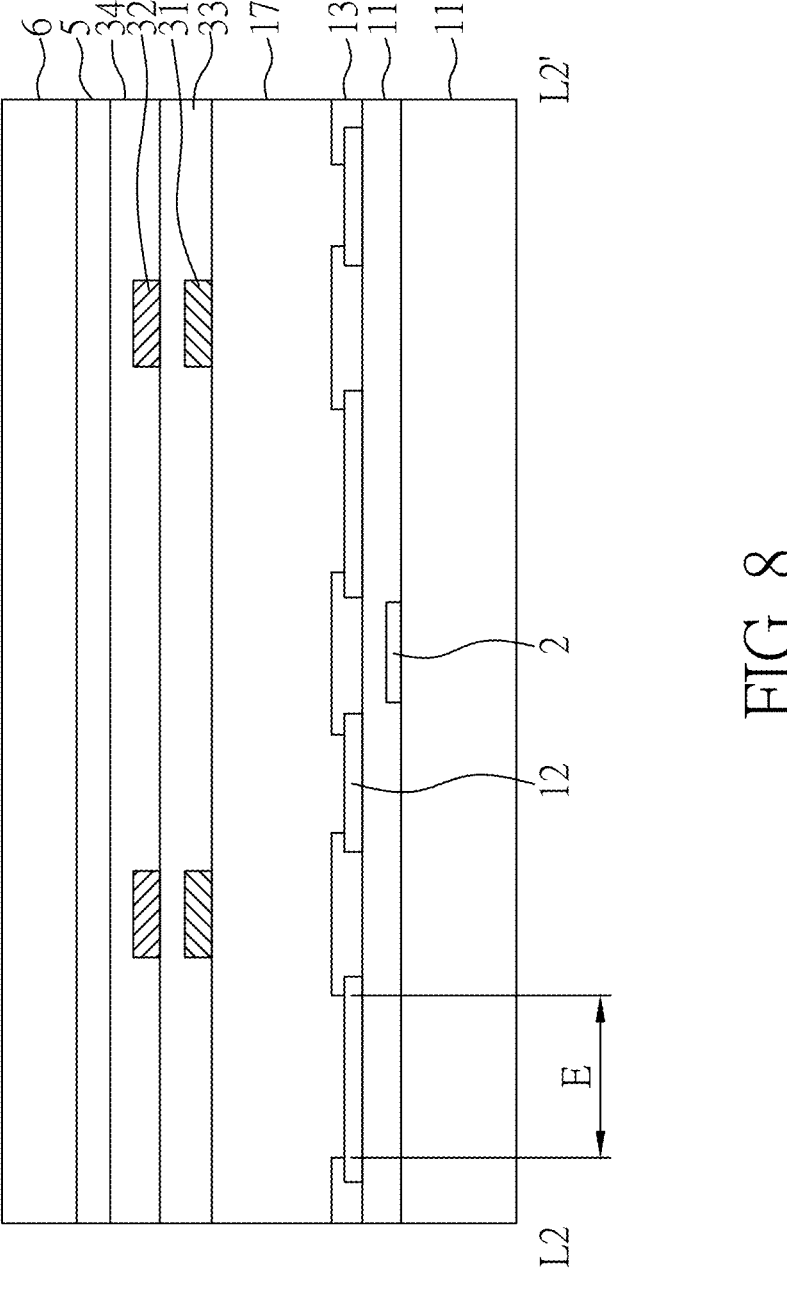
FIG. 8 is a cross-sectional view of a display device according to Embodiment 7 of the present disclosure.

FIG. 8 is a cross-sectional view of a display device according to the present embodiment, which is a cross section along the line L2-L2' indicated in FIG. 1. The OLED display device shown in Embodiment 1 is illustrated in the present embodiment.

In the present embodiment, an encapsulating layer 17 is disposed on the display medium layer 12 and the pixel defining layer 13. A material of the encapsulating layer 17 can be resin, polymer, photoresist, or a combination thereof, but the present disclosure is not limited thereto.

As shown in FIG. 8, the display device of the present embodiment further comprises: a first touch electrode 31 disposed on the encapsulating layer 17; a first insulating layer 33 disposed on the first touch electrode 31; a second touch electrode 32 disposed on the first insulating layer 33; and a second insulating layer 34 disposed on the second touch electrode 32. Herein, the material for the first insulating layer 33 and the second insulating layer 34 can be, for example, a silicon oxide, a silicon oxynitride, a silicon nitride, aluminum oxide, resin, polymer, photoresist, or a combination thereof; but the present disclosure is not limited thereto. The material for the first touch electrode 31 and the second touch electrode 32 can be a metal (especially, an opaque conducting metal), such as Cu or Ag; but the present disclosure is not limited thereto. Herein, the first touch electrode 31 can drive Tx touch signal and the second touch electrode 32 can sense Rx touch signal; and vise versa.

As shown in FIG. 1 and FIG. 8, the first touch electrode 31 and the second touch electrode 32 are disposed in the display region AA of the display device. When the material of the first touch electrode 31 and the second touch electrode 32 is made of metal materials, the incident light from an upper side of the display device may be shielded by the first touch electrode 31 and the second touch electrode 32. The sensors 2 may be disposed to avoid overlapping the first touch electrode 31 and the second touch electrode 32 in the normal direction of the substrate 111 to improve sensing resolution.

In addition, as shown in FIG. 2 and FIG. 8, the driving layer 11 comprises a transistor TFT, and the sensor 2 is disposed on the substrate 111 and adjacent to the transistor TFT.

Embodiment 8

Figure 9:
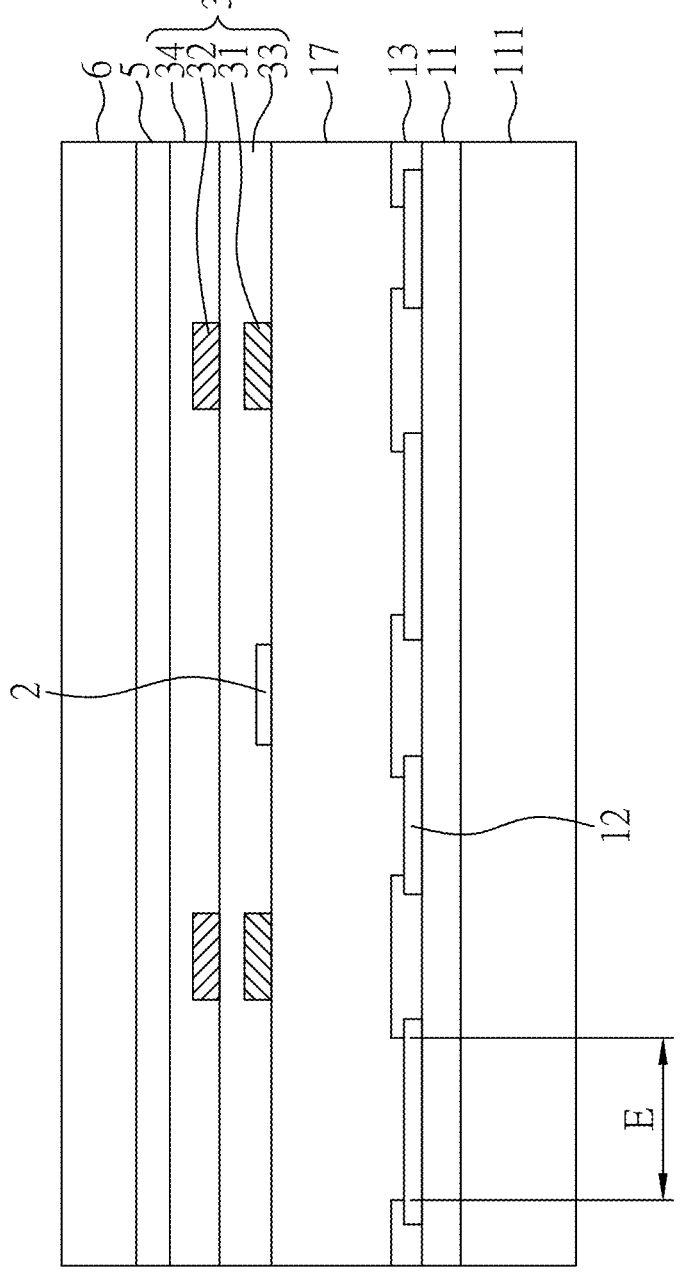
FIG. 9 is a cross-sectional view of a display device according to Embodiment 8 of the present disclosure.

FIG. 9 is a cross-sectional view of a display device according to the present embodiment. The display device of the present embodiment is similar to that shown in Embodiment 7, except for the sensor position.

In the present embodiment, the display device further comprises a touch sensor layer 3 disposed on the display medium layer 12, wherein the touch sensor layer 3 comprises the first touch electrode 31 and the second touch electrode 32, and the sensor 2 is disposed on the display medium layer 12 and adjacent to the first touch electrode 31. In another embodiment of the present disclosure, the sensor 2 can be adjacent to the second touch electrode 32.

Embodiment 9

Figure 10:
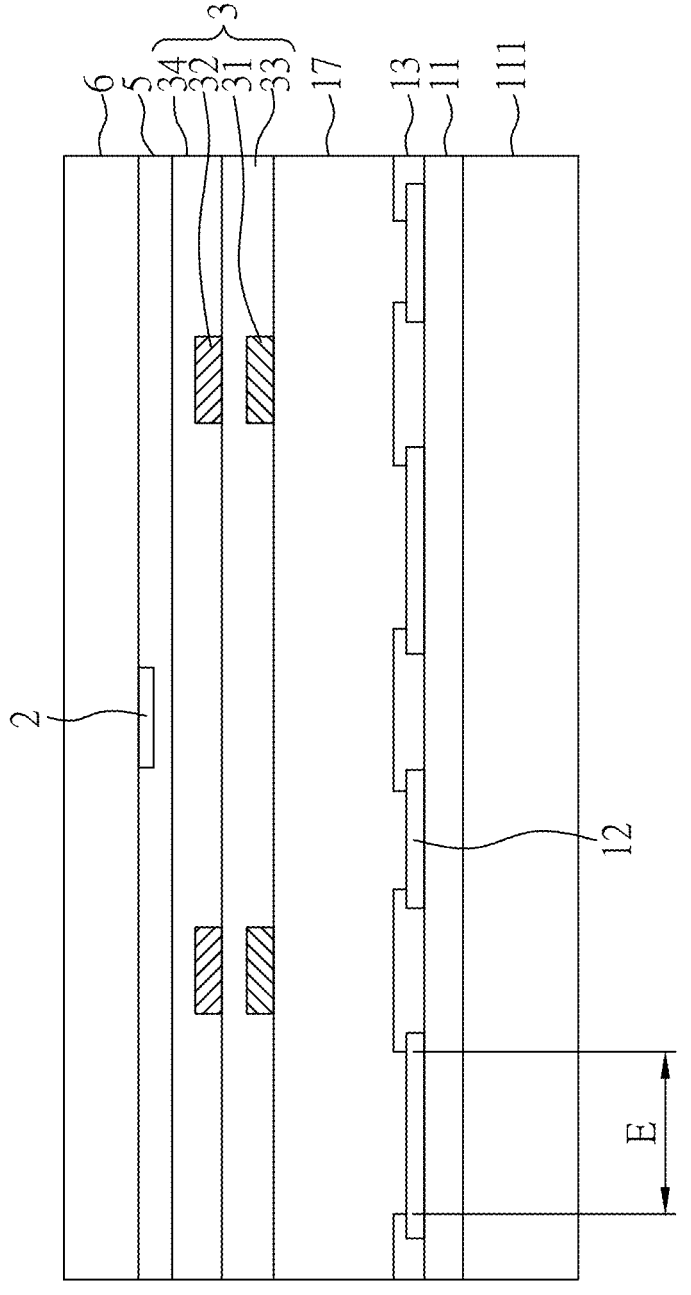
FIG. 10 is a cross-sectional view of a display device according to Embodiment 9 of the present disclosure.

FIG. 10 is a cross-sectional view of a display device according to the present embodiment. The display device of the present embodiment is similar to that shown in Embodiment 7, except for the sensor position.

In the present embodiment, the display device further comprises: a touch sensor layer 3 disposed on the display medium layer 12; and a protection substrate 6 disposed on the touch sensor layer 3, wherein the sensor 2 is disposed between the touch sensor layer 3 and the protection substrate 6. Herein, the protection substrate 6 can be a cover glass or a polarizer, but the present disclosure is not limited thereto.

In particular, in the present embodiment, the display device further comprises: a functional layer 5 disposed between the touch sensor layer 3 and the protection substrate 6, wherein the sensor 2 is disposed in the functional layer 5. Examples of the functional layer 5 may comprise an optical clear adhesive, a tape or other adhesion material, a polarizer, an anti-glare film, etc., but the present disclosure is not limited thereto.

Embodiment 10

Figure 11:
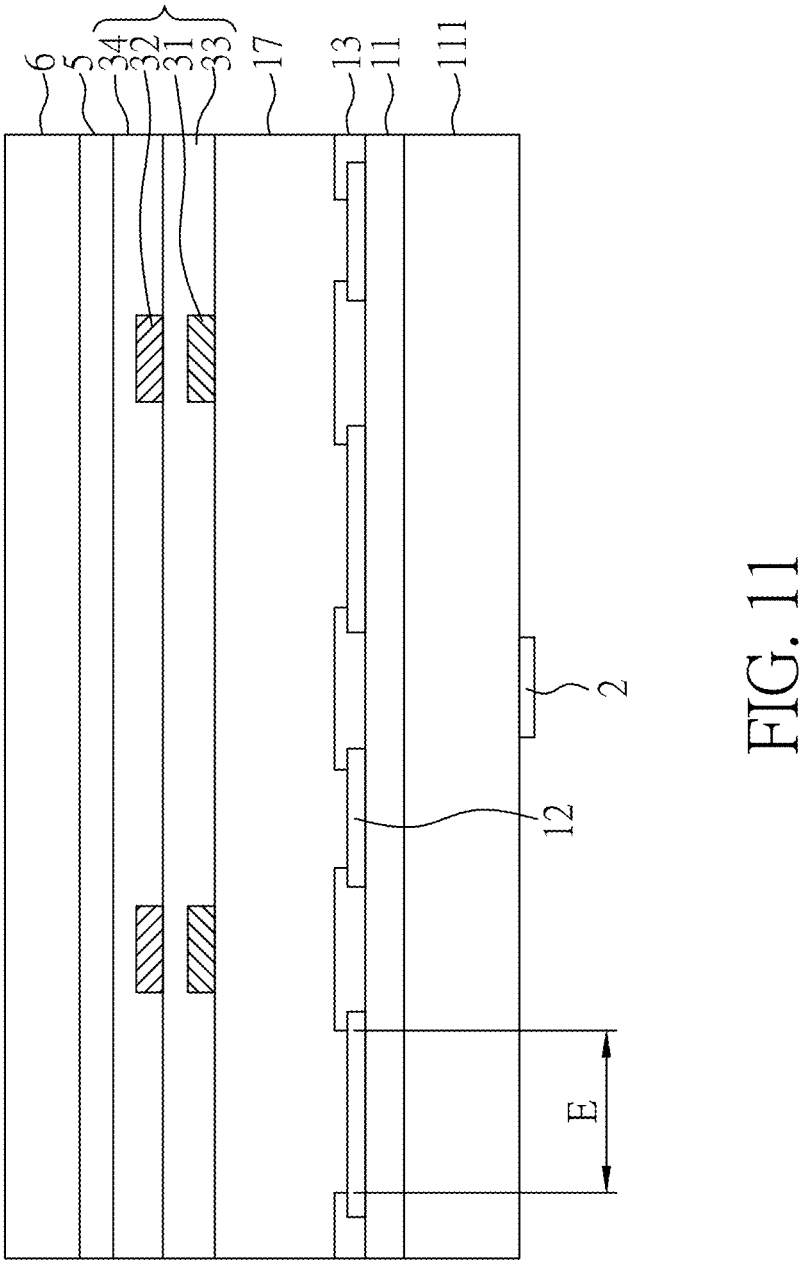
FIG. 11 is a cross-sectional view of a display device according to Embodiment 10 of the present disclosure.

FIG. 11 is a cross-sectional view of a display device according to the present embodiment. The display device of the present embodiment is similar to that shown in Embodiment 7, except for the sensor position.

In the present embodiment, the sensor 2 is disposed below the substrate 111. In other words, the sensor 2 is disposed on a surface of the substrate 111 which is opposite to another surface of the substrate 111 adjacent to the display medium layer 12.

In Embodiments 7 to 10 shown in FIG. 8 to FIG. 11, the sensor 2 does not overlap the first touch electrode 31, the second touch electrode 32 and the light emitting regions E.

Embodiment 11

Figure 12:
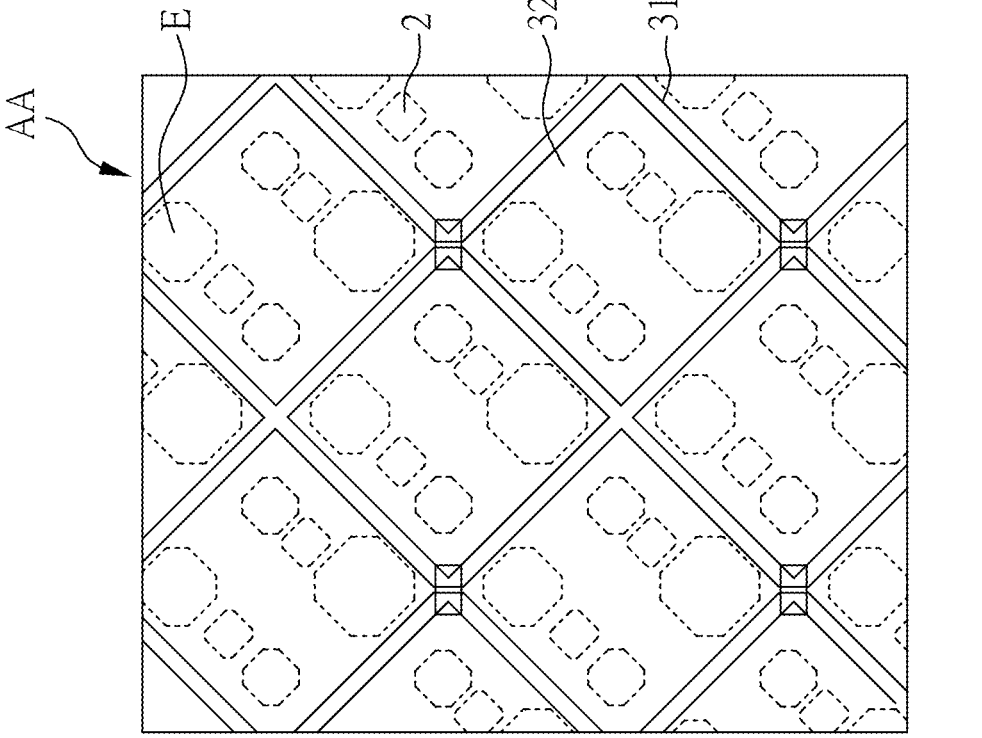
FIG. 12 is a cross-sectional view of a display device according to Embodiment 11 of the present disclosure.

FIG. 12 is a cross-sectional view of a display device according to the present embodiment. The display device of the present embodiment is similar to that shown in Embodiment 7, except for the types of the touch electrodes.

In the present embodiment, the display device further comprises a first touch electrode 31 and a second touch electrode 32 disposed in the display region AA of the display device, wherein the material of the first touch electrode 31 and the second touch electrode 32 can be a transparent conductive oxide such as ITO, IZO, ITZO, IGZO, or AZO. However, the present disclosure is not limited thereto. Herein, the first touch electrode 31 can drive Tx touch signal and the second touch electrode 32 can sense Rx touch signal; and vise versa.

Because the first touch electrode 31 and the second touch electrode 32 made by the transparent conductive oxide have high transparency, the sensors 2 can overlap the first touch electrode 31 and the second touch electrode 32 in the normal direction of the display device.

In the aforementioned embodiments, the spacer 14 has a regular shape. However, the present disclosure is not limited thereto. In other embodiments of the present disclosure, the spacer 14 may have a tapered profile that different portions have different thicknesses.

Figure 13:
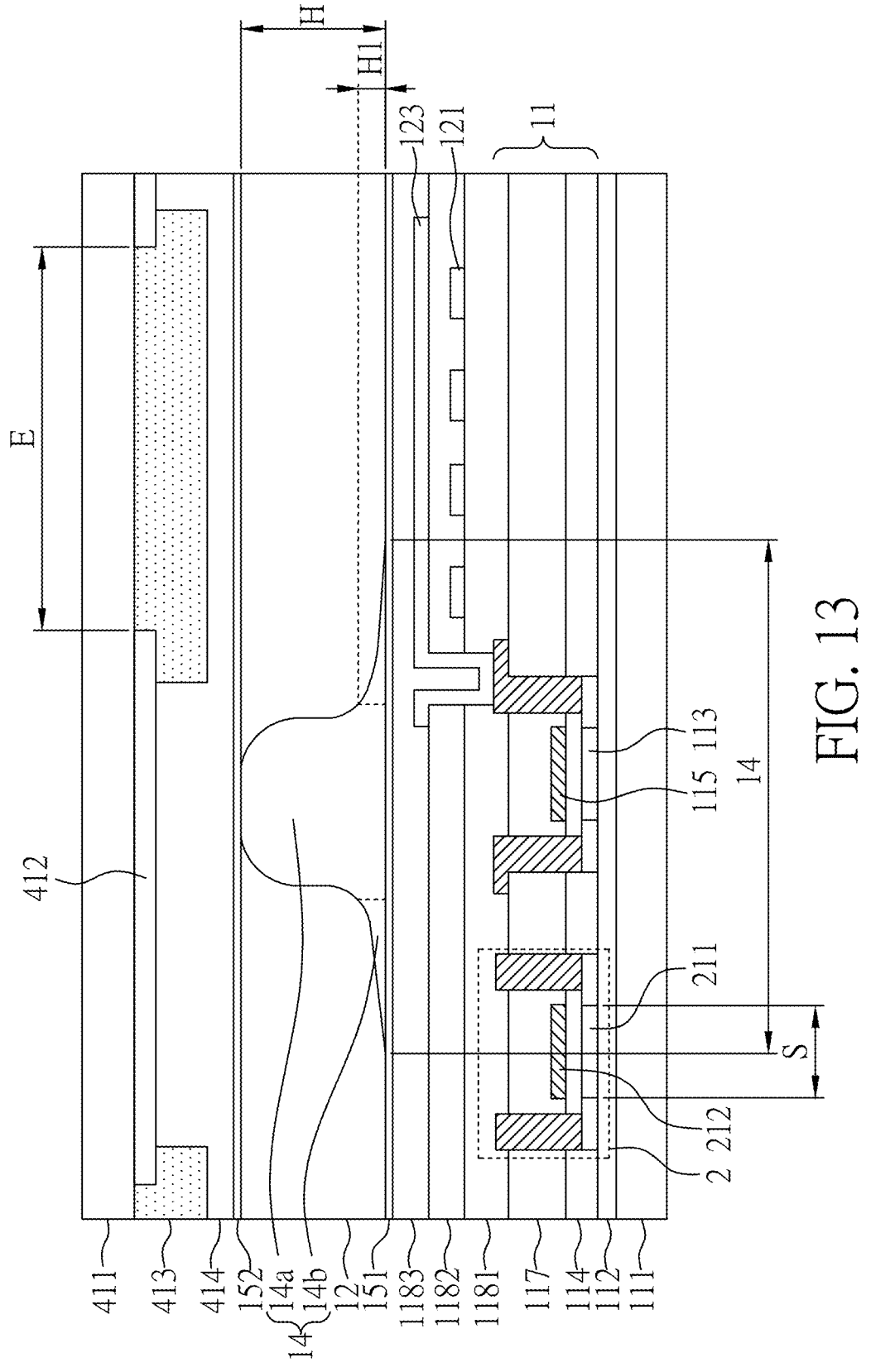
FIG. 13 is a cross-sectional view of a display device illustrating a situation that a sensor does not overlap a spacer.
Figure 14:
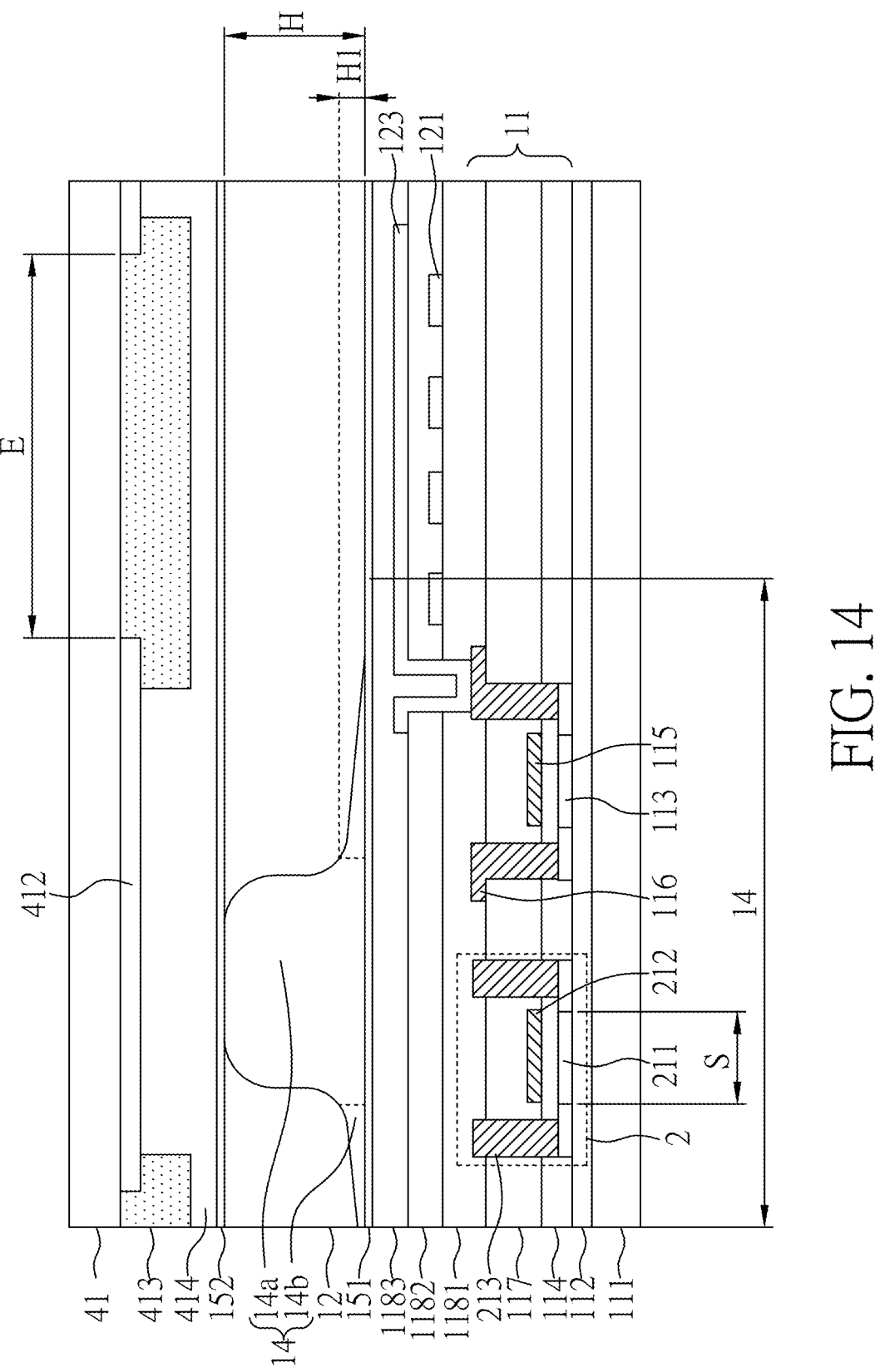
FIG. 14 is a cross-sectional view of a display device illustrating a situation that a sensor overlaps a spacer.

Hereinafter, FIG. 13 and FIG. 14 are used to illustrate the situation how to define the spacer with the tapered profile overlapping or not overlapping the sensor.

FIG. 13 is a cross-sectional view of a display device illustrating a situation that a sensor does not overlap a spacer, and FIG. 14 is a cross-sectional view of a display device illustrating a situation that a sensor overlaps a spacer. The structures of the display devices shown in FIG. 13 and FIG. 14 are similar to that shown in FIG. 3, and are not repeated again.

When the spacer has the tapered profile, the spacer can be defined to have a main portion 14a and a lower portion 14b, wherein the lower portion 14b has a height H1 which is 15% or less of the overall thickness H of the spacer 14 (H1≤15%× H), and the rest of the spacer 14 is the main portion 14a.

The spacer 14 used in the present disclosure may be transparent. The lower portion 14b of the spacer 14 still has good transparency. But the main portion 14a of the spacer 14, since having thicker thickness than the lower portion 14b, the main portion 14a is becoming semi-transparent. If the lower portion 14b of the spacer 14 overlaps the sensor 2 (especially the sensing area S) as shown in FIG. 13, the lower portion 14b may not significantly affect the incident light from the upper side of the display device, and the sensing resolution is not altered. However, if the sensor 2 overlaps the main portion 14a of the spacer 14 as shown in FIG. 14, the incident light is mostly distorted or altered, so the resolution of the sensor 2 is affected, resulting in blurry image. Hence, in the present disclosure, the sensor 2 has to be designed not overlapping the main portion 14a of the spacer 14.

In the aforementioned embodiments, only the OLED display device and the LCD device are disclosed, but the present disclosure is not limited thereto. In other embodiments of the present disclosure, the display medium may comprise quantum dots (QDs), fluorescence molecules, phosphors, normal inorganic light-emitting diodes (normal LEDs, in which the size of the chip contained therein is ranged from 300 μm to 10 mm), mini inorganic light-emitting diodes (mini LEDs, in which the size of the chip contained therein is ranged from 100 μm to 300 μm), micro inorganic light-emitting diodes (micro LEDs, in which the size of the chip contained therein is ranged from 1 μm to 100 μm), or other display medium; but the present disclosure is not limited thereto.

Furthermore, in the aforementioned embodiments, only the on-cell touch display devices are disclosed, but the present disclosure is not limited thereto. In other embodiments of the present disclosure, the display device can be an in-cell touch display device or an out-cell touch display device depending on the disposition of the touch electrodes.

Meanwhile, a display device or touch display device made as described in any of the embodiments of the present disclosure as described previously may be applied to any electronic devices known in the art that need a display screen, such as displays, mobile phones, laptops, video cameras, still cameras, music players, mobile navigators, TV sets, and other electronic devices that display images.

Although the present disclosure has been explained in relation to its embodiment, it is to be understood that many other possible modifications and variations can be made without departing from the spirit and scope of the disclosure as hereinafter claimed.

What is claimed is:

1. A display device having a display region, comprising:
   a substrate having a first surface and a second surface opposite to the first surface;
   a driving layer disposed on the first surface of the substrate;
   a self-emitting layer disposed on the driving layer and comprising a reflective electrode;
   a plurality of sensors overlapping the display region in a normal direction of the first surface of the substrate;
   a pixel defining layer disposed on the reflective electrode, wherein the pixel defining layer comprises a top surface and a bottom surface opposite to the top surface, and the bottom surface faces the driving layer;
   a spacer disposed on the top surface of the pixel defining layer; and
   a plurality of first touch electrodes and a plurality of second touch electrodes disposed in the display region, wherein in the normal direction of the first surface of the substrate, at least two of the plurality of sensors overlaps one of the plurality of first touch electrodes or one of the plurality of second touch electrodes;
   wherein the plurality of sensors are adjacent to the second surface of the substrate away from the driving layer;
   wherein the spacer overlaps one of the plurality of first touch electrodes or one of the plurality of second touch electrodes in the normal direction of the first surface of the substrate.

2. The display device of claim 1, wherein an area of one of the plurality of sensors is less than an area of one of the plurality of first touch electrodes.

3. The display device of claim 1, wherein an area of one of the plurality of sensors is less than an area of one of the plurality of second touch electrodes.

4. The display device of claim 1, wherein in a direction perpendicular to the normal direction of the first surface of the substrate, one of the plurality of sensors and the spacer are separated by a first distance, and the first distance is greater than 0.

5. The display device of claim 1, wherein the plurality of sensors are disposed below the substrate.

6. The display device of claim 1, wherein the display region comprises a plurality of light emitting regions, in a direction perpendicular to the normal direction of the first surface of the substrate, one of the plurality of sensors and one of the plurality of light emitting regions are separated by a second distance, and the second distance is greater than 0.

7. The display device of claim 1, wherein the spacer have a tapered profile.

8. The display device of claim 1, wherein the spacer comprises a main portion and a lower portion, and a thickness of the main portion is different from a thickness of the lower portion.

* * * * *